US006552297B2

(12) United States Patent
Blonigan et al.

(10) Patent No.: US 6,552,297 B2
(45) Date of Patent: Apr. 22, 2003

(54) RF MATCHING NETWORK WITH DISTRIBUTED OUTPUTS

(75) Inventors: Wendell T. Blonigan, Union City, CA (US); Carl A. Sorensen, Morgan Hill, CA (US)

(73) Assignee: Applied Komatsu Technology, Inc., Tokyo (JP)

( * ) Notice: Subject to any disclaimer, the term of this patent is extended or adjusted under 35 U.S.C. 154(b) by 0 days.

(21) Appl. No.: 10/003,129

(22) Filed: Nov. 1, 2001

(65) Prior Publication Data

US 2002/0046989 A1 Apr. 25, 2002

Related U.S. Application Data

(62) Division of application No. 09/664,983, filed on Sep. 18, 2000, which is a continuation of application No. 09/114,953, filed on Jul. 13, 1998, now abandoned.

(51) Int. Cl.⁷ .............................................. B23K 10/00
(52) U.S. Cl. ................................ 219/121.43; 333/17.3; 118/723 E
(58) Field of Search ....................... 219/121.43, 121.57, 219/121.54, 121.4, 121.38, 121.36; 333/17.3; 118/723 E; 334/56; 156/345; 315/248

(56) References Cited

U.S. PATENT DOCUMENTS

| 3,475,702 A | 10/1969 | Ainsworth |
| 3,569,777 A | 3/1971 | Beaudry |
| 3,594,295 A | 7/1971 | Meckel et al. |
| 3,675,093 A | 7/1972 | Russo et al. |
| 3,872,278 A | 3/1975 | Boom |
| 4,229,826 A | 10/1980 | Wanzer |
| 4,272,743 A | 6/1981 | Evans |

(List continued on next page.)

FOREIGN PATENT DOCUMENTS

| DE | 4242894 | 12/1992 |
| DE | 4242894 | * 6/1994 |
| EP | 0520519 | 12/1992 |
| EP | 0607797 | 7/1994 |
| EP | 0714106 | 5/1996 |
| EP | 0878826 | 11/1998 |
| GB | 2162365 | 1/1986 |

(List continued on next page.)

OTHER PUBLICATIONS

PCT/US99/15854, Written Opinion issued Jun. 27, 2000.
L. Sansonnens, et al., "A Voltage Uniformity Study In Large–Area Reactors For RF Plasma Deposition," Plasma Sources Sci. Technol. 6: 170–178 (1997).
ISR issued to PCT/US99/15854, Nov. 18, 1999.
N. Jiwari et al., "Helicon wave plasma reactor employing single–loop antenna," J. of Vac. Sci. Technol., A 12(4), pp. 1322–1327, Jul./Aug. 1994.

(List continued on next page.)

Primary Examiner—Teresa Walberg
Assistant Examiner—Quang T. Van
(74) Attorney, Agent, or Firm—Konrad, Raynes, Victor & Mann LLP

(57) ABSTRACT

An apparatus for distributing RF power outputs to a first electrode in a parallel plate electrode system for generating plasma in depositing films on a substrate. A RF power output is applied to a distributed RF matching network to excite a plasma from a process gas stream to deposit a uniform film onto the substrate. The distributed matching network includes a load capacitor for receiving a radio frequency power input and an inductor having first and second ends with the first end coupled to the load capacitor. The matching network also includes multiple drive capacitors each of which couples the second end of the inductor to a different one of multiple points distributed on the first electrode. The capacitance of each drive capacitor is user-selectable, and the points on the backing plate to which the drive capacitors are coupled are user-selectable.

38 Claims, 6 Drawing Sheets

U.S. PATENT DOCUMENTS

| | | | |
|---|---|---|---|
| 4,284,490 A | 8/1981 | Weber | |
| 4,336,118 A | 6/1982 | Patten et al. | |
| 4,362,632 A | 12/1982 | Jacob | |
| 4,626,312 A | 12/1986 | Tracy | |
| 4,661,228 A | 4/1987 | Mintz | |
| 4,712,112 A | 12/1987 | Carr | |
| 4,716,491 A | 12/1987 | Ohno et al. | |
| 4,792,732 A | 12/1988 | O'Loughlin | |
| 4,854,263 A * | 8/1989 | Chang et al. | 118/715 |
| 4,871,421 A | 10/1989 | Ogle et al. | |
| 4,891,087 A * | 1/1990 | Davis et al. | 156/345 |
| 4,918,031 A | 4/1990 | Flamm et al. | |
| 4,941,915 A | 7/1990 | Matsuoka et al. | |
| 4,966,669 A * | 10/1990 | Sadamori et al. | 204/192.12 |
| 4,990,229 A | 2/1991 | Campbell et al. | |
| 4,999,096 A | 3/1991 | Nihei et al. | |
| 5,122,251 A | 6/1992 | Campbell et al. | |
| 5,146,137 A | 9/1992 | Gesche et al. | |
| 5,178,739 A | 1/1993 | Barnes et al. | |
| 5,186,718 A | 2/1993 | Tepman et al. | |
| 5,192,849 A * | 3/1993 | Moslehi | 219/121.43 |
| 5,195,045 A | 3/1993 | Keane et al. | |
| 5,234,560 A | 8/1993 | Kadlec et al. | |
| 5,241,245 A | 8/1993 | Barnes et al. | |
| 5,280,154 A | 1/1994 | Cuomo et al. | |
| 5,292,393 A | 3/1994 | Maydan et al. | |
| 5,304,279 A | 4/1994 | Coultas et al. | |
| 5,346,578 A | 9/1994 | Benzing et al. | |
| 5,361,016 A | 11/1994 | Ohkawa et al. | |
| 5,366,585 A * | 11/1994 | Robertson et al. | 216/67 |
| 5,392,018 A | 2/1995 | Collins et al. | |
| 5,397,962 A | 3/1995 | Moslehi | |
| 5,401,350 A * | 3/1995 | Patrick et al. | 156/345 |
| 5,404,079 A | 4/1995 | Ohkuni et al. | |
| 5,418,431 A | 5/1995 | Williamson et al. | |
| 5,424,691 A | 6/1995 | Sadinsky | |
| 5,429,070 A | 7/1995 | Campbell et al. | |
| 5,429,995 A | 7/1995 | Nishiyama et al. | |
| 5,430,355 A | 7/1995 | Paranjpe | |
| 5,431,799 A | 7/1995 | Mosely et al. | |
| 5,473,291 A * | 12/1995 | Brounley | 333/17.3 |
| 5,503,676 A | 4/1996 | Shufflebotham et al. | |
| 5,571,366 A | 11/1996 | Ishii et al. | |
| 5,573,595 A | 11/1996 | Dible | |
| 5,585,766 A | 12/1996 | Shel | |
| 5,591,493 A | 1/1997 | Paranjpe et al. | |
| 5,639,357 A | 6/1997 | Xu | |
| 5,643,364 A | 7/1997 | Zhao et al. | 118/723 E |
| 5,683,537 A * | 11/1997 | Ishhi | 156/345 |
| 5,688,357 A | 11/1997 | Hanawa | |
| 5,689,215 A | 11/1997 | Richardson et al. | |
| 5,716,451 A | 2/1998 | Hama et al. | |
| 5,733,511 A | 3/1998 | De Francesco | |
| 5,753,044 A * | 5/1998 | Hanawa et al. | 118/723 I |
| 5,759,280 A | 6/1998 | Holland et al. | |
| 5,793,162 A | 8/1998 | Barnes | |
| 5,795,429 A | 8/1998 | Ishii et al. | |
| 5,800,619 A | 9/1998 | Holland et al. | |
| 5,800,688 A | 9/1998 | Lantsman et al. | |
| 5,815,047 A * | 9/1998 | Sorensen et al. | 333/17.3 |
| 5,851,600 A | 12/1998 | Horiike et al. | |
| 5,874,704 A | 2/1999 | Gates | |
| 5,892,198 A * | 4/1999 | Barnes et al. | 219/121.54 |
| 6,041,734 A * | 3/2000 | Raoux et al. | 118/723 E |
| 6,199,506 B1 * | 3/2001 | Hilliker et al. | 118/723 E |

FOREIGN PATENT DOCUMENTS

| | | |
|---|---|---|
| GB | 2231197 | 11/1990 |
| JP | 61190070 | 8/1986 |
| JP | 63246814 | 10/1988 |
| JP | 6232055 | 8/1994 |
| JP | 6283470 | 10/1994 |
| JP | 7176398 | 7/1995 |
| JP | 7176399 | 7/1995 |
| JP | 8288259 | 11/1996 |
| WO | 8606923 | 11/1986 |
| WO | 9505060 | 2/1995 |
| WO | WO 972474 | 7/1997 |
| WO | WO 997913 | 2/1999 |

OTHER PUBLICATIONS

M. Yamashita, "Sputter Type High Frequency Ion Source for Ion Beam Deposition Apparatus," *Jap. J. Appl. Phys.*, vol. 26, pp. 721–727, 1987.

P. Kidd, "A Magnetically Confined and ECR Heated Plasma Machine for Coating and Ion Surface Modification Use," *J. Vac. Sci. Technol.*, vol. A9, pp. 466–473, 1991.

W.M. Holber, et al., "Copper Deposition by Electron Cyclotron Resonance Plasma," *J. Vac. Sci. Technol.*, vol. A11, pp. 2903–2910, 1993.

S.M. Rossnagel, "Directional and Ionized Sputter Deposition for Microelectronics Applications," *Proc. of 3rd ISSP (Tokyo)*, pp. 253–260, 1995.

M. Matsuoka et al., Dense Plasma Production and Film Deposition by New High–Rate Sputtering Using an Electric Mirror, *J. Vac. Sci. Technol.*, A 7 (4), 2652–2657, Jul./Aug. 1989.

M. Yamashita, "Fundamental Characteristics of Built–in High Frequency Coil Type Sputtering Apparatus," *J. Vac. Sci. Technol.*, vol. A7, pp. 151–158, 1989.

S.M. Rossnagel et al., "Magnetron Sputter Deposition with High Levels of Metal Ionization," *Appl. Phys. Lett.*, vol. 63, pp. 3285–3287, 1993.

J. Hopwood et al., "Mechanisms for Highly Ionized Magnetron Sputtering," *J. Appl. Phys.*, vol. 78, pp. 758–765, 1995.

Search report dated Feb. 27, 1997, EPC application No. 96308251.6.

U.S. patent application Ser. No. 08/857,921 filed May 16, 1997.

U.S. patent application Ser. No. 08/857,720 filed May 16, 1997.

U.S. patent application Ser. No. 08/908,341 filed Aug. 7, 1997.

U.S. patent application Ser. No. 09/052,868 filed Mar. 31, 1998.

PCT Search Report issued on Jul. 22, 1999 in PCT/US99/06441.

EPO Search Report issued Jul. 22, 1999 in 98303794.6.

EPO Search Report issued Aug. 13, 1999 in 98303813.4.

* cited by examiner

RF MATCHING NETWORK WITH DISTRIBUTED OUTPUTS

RELATED APPLICATIONS

This application is a divisional application of application Ser. No. 09/664,983 filed Sep. 18, 2000 which is a continuation application of application Ser. No. 09/114,953, filed Jul. 13, 1998.

BACKGROUND

This invention relates to systems and methods of film deposition, and more particularly, to improved systems and methods for depositing a high quality film onto a large area substrate.

In recent years, liquid crystal cells have been developed to form high quality displays that are light-weight and consume low power. These liquid crystal cells typically include two glass substrates with a layer of a liquid crystal material sandwiched therebetween. Electrically conductive films are patterned on the substrates to form circuit elements such as thin film transistors (TFTs). The substrate can be connected to a power source to change the orientation of the liquid crystal material such that various regions of the liquid crystal display can be selectively energized using the TFTs.

Reactors for depositing films onto the large area glass substrates typically deploy plasma enhanced chemical vapor deposition (PECVD) equipment. A high frequency power supply is typically used to induce a breakdown of process gases within the PECVD process chamber. As glass substrates are typically much larger than silicon substrates, the dimensions of the electrode may approach the quarter-wavelength of the power supply frequency. Such conditions lead to an uneven discharge of electrical energy over the surface of the large substrate. This non-uniform voltage distribution can result in an uneven film deposition on the substrate surface.

Traditional solutions to the uneven film deposition have involved adjusting various process variables, including pressure, gas composition, flow rate, radio frequency (RF) power level, and electrode spacing, among others. Adjusting these process variables works well for relatively small substrates. However, as the size of the substrate, the size of the chamber and the frequency of the power supply increase, the film deposited on the substrate may be non-uniform.

SUMMARY

In general, in one aspect, an apparatus is disclosed for distributing RF power outputs to a first electrode in a parallel plate electrode system for generating plasma in depositing films on a substrate. The apparatus includes a RF power supply and a matching network coupling the RF power supply to multiple points distributed on the first electrode.

In some implementations, the RF outputs are coupled directly to a backing plate which serves as the electrical connection between outputs from one or more matching networks and a shower head.

In one exemplary implementation, the apparatus includes a load capacitor for receiving a radio frequency power input and an inductor having first and second ends, with the first end coupled to the load capacitor. The apparatus also includes multiple drive capacitors each of which electrically couples the second end of the inductor to a different one of multiple points distributed on the first electrode.

In some implementations, the capacitance of each drive capacitor is user-selectable. Similarly, in some implementations, the points on the first electrode to which the drive capacitors are coupled are user-selectable. Such features allow a user to adjust the values of the drive capacitors as well as the locations of the points on the first electrode to which the drive capacitors are coupled to improve the uniformity of the deposited film.

The apparatus can be incorporated into a system for depositing a thin film, where the system also includes, for example, a vacuum chamber in which a substrate to be processed and the first electrode are positioned, a process gas source coupled to the first electrode to introduce a gas stream into the chamber, and a heater for heating the substrate in the chamber.

The distributed impedance matching network can be used in various plasma enhanced processing systems which include one or more RF power supplies. In systems having multiple power supplies, the distributed matching network can be used to couple, for example, a high frequency power supply to the first electrode.

In another aspect, a method of processing a thin film on a substrate includes providing a radio frequency power input to a load capacitor and an inductor where the inductor is coupled to multiple drive capacitors, and applying an output of each respective drive capacitor to a different one of multiple points distributed on an electrode. In some implementations, the capacitance of each drive capacitor can be adjusted to arrive at a composite predetermined value. As previously noted, the values of the drive capacitors as well as the locations of the points on the electrode to which the drive capacitors are coupled can be adjusted to improve the uniformity of the deposited film.

Various implementations include one or more of the following advantages. By supporting movable tie points from the RF power supply outputs to the electrode, the system provides a spatial control variable which allows a user to select or adjust the locations on the electrode to which the drive capacitors are coupled electrically. Additionally, by allowing a user to select the individual values of the capacitors, the system provides an electrical control variable. The spatial control variable and the electrical control variable supplement the traditional process variables, including pressure, gas composition, flow rate, RF power level, and electrode spacing such that more uniform films are deposited. Substantially uniform films interface better to subsequently deposited layers. Other film properties such as density and stress also are improved, and a high deposition rate can be achieved.

Other features and advantages of the invention will become apparent from the following description, including the drawings and claims.

DETAILED DESCRIPTION

Generally, in operation of the present invention, a large substrate is supported in a vacuum deposition process chamber, and is heated to several hundred degrees Celsius (°C.). The substrate may be made of glass, quartz or a polymer such as plastic, among others. The substrate size can be, for example, approximately 650 by 830 millimeters (mm), although the trend is toward even larger sizes. Deposition gases are injected into the chamber, and excited by a dual RF power supply system. A plasma-enhanced chemical vapor deposition reaction occurs to deposit a thin film layer onto the substrate. The deposited thin film layer may be a dielectric layer, such as silicon nitride (SiN) or silicon oxide ($SiO_2$), or a semiconductor layer, such as amorphous silicon (a-Si).

Figure 1:
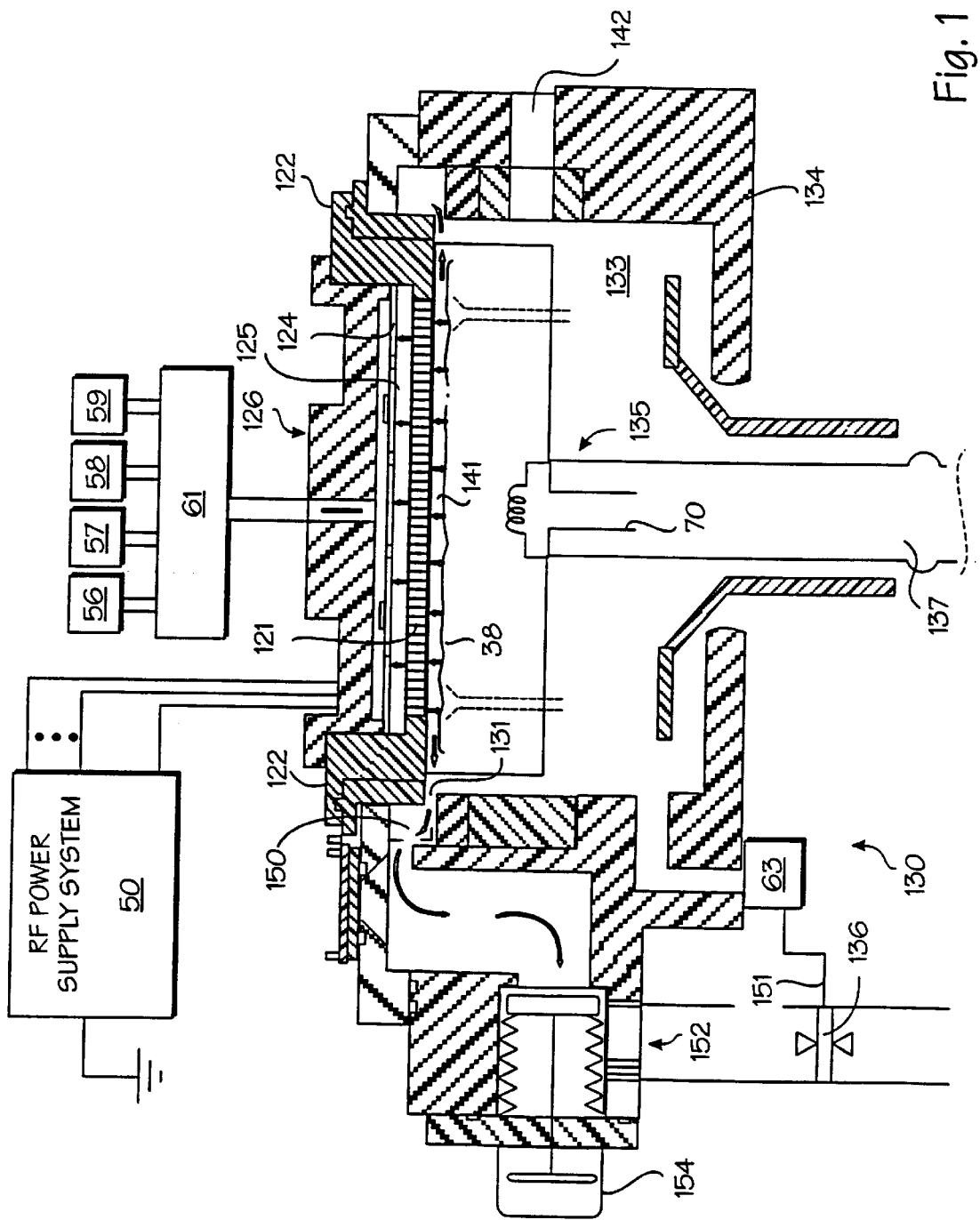
FIG. 1 is a cross-sectional view of a reactor for performing PECVD using a RF power supply matching network with distributed outputs in accordance with the invention.

Turning to FIG. 1, a PECVD system 130 includes a susceptor 135 having a stem 137. The susceptor 135 is centered within a vacuum deposition process chamber 133. The susceptor 135 holds a substrate 38, such as a large glass panel, in a substrate processing or reaction region 141. A lift mechanism (not shown) is provided to raise and lower the susceptor 135. The substrate 38 is transferred into and out of the chamber 133 through an opening 142 in a sidewall 134 of the chamber 133 by a substrate transferring system (not shown). The substrate 38 is then heated, for example, to a temperature between about 250° C. and 450° C., by a heater 70, which can be a resistive heater embedded in the susceptor 135. Alternatively, other suitable heaters can be used.

One or more deposition process gases flow into the chamber 133 through a gas source manifold 61 and a backing plate 126. The gas source manifold 61 receives gases from sources 56, 57, 58 and 59. The process gas flows through a perforated blocker plate 124 and multiple holes 121 in a process gas distribution faceplate or showerhead 122. Various showerhead configurations may be used, including those shown in U.S. Pat. Nos. 4,854,263, 5,611,865 and 5,366,585, hereby incorporated by reference in their entirety. The electrode spacing or the distance between the substrate surface and the discharge surface of the showerhead 122 can be between about 400 to 1,500 mils. The process gas flow is indicated by small arrows in the substrate processing region 141 of FIG. 1. During operation, the chamber 133 is typically maintained at a pressure between about 0.4 Torr and 3 Torr, and at a temperature between about 250° C. and 450° C.

In the chamber shown in FIG. 1, a plasma is generated to enhance the deposition process. The deposition process gases may be exhausted from the chamber through a slot-shaped orifice 131 surrounding the substrate processing region 141 into an exhaust plenum 150. From exhaust plenum 150, the gases flow by a vacuum shut-off valve 154 and into an exhaust outlet 152 which connects to an external vacuum pump (not shown).

A manometer 63 measures the pressure of gases in chamber 133. The manometer 63 can be replaced, however, by numerous other types of pressure sensors. As an example, an ion gauge could be used. A governor 136 may be disposed in the exhaust stream to regulate the overall pressure in the chamber 133. A signal 151 from manometer 63 may be used as an input to an electrical controller of the governor 136 so as to maintain the total chamber pressure constant.

Figure 2:
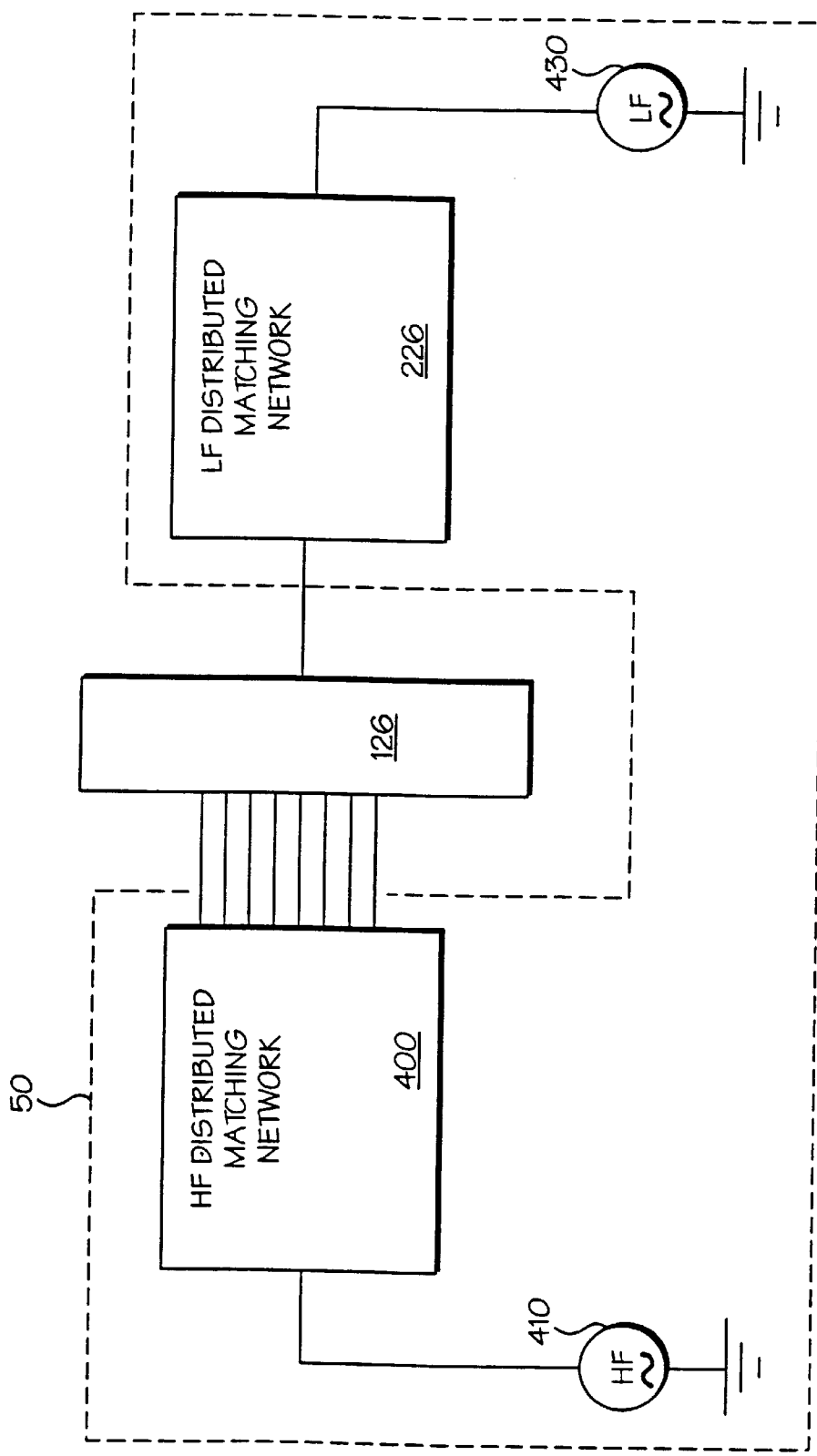
FIG. 2 is a block diagram showing a power supply and matching networks for driving a backing plate according to the invention.

In the particular implementation shown in FIG. 1, a plasma ignition circuit having a dual frequency RF power supply system 50 is used. The dual frequency RF power supply system 50 includes a first or high frequency (HF) RF power supply generator 410, a second or low frequency (LF) RF power supply generator 430, a distributed impedance matching network 400 for the first power supply generator 410, and a matching network 226 for the second power supply generator 430 (FIG. 2). The high frequency RF power supply 410 output is provided to the distributed impedance matching network 400, and the low frequency RF power supply 430 output is provided to the low frequency (LF) matching network 226. Multiple outputs of the distributed matching network 400 are attached, as described in greater detail below, to the backing plate 126 which serves as the electrical connection between the outputs from the matching network 400, 226 and the shower head 122. The matching network 226 has only a single output and is attached, for example, to the center of the backing plate 126. In this manner, electrical power can be applied between the shower head 122 and susceptor 135 so as to excite the process gas mixture to form a plasma. Although the particular implementation shown in FIGS. 1 and 2 illustrates a dual frequency RF power supply system, the distributed impedance matching network 400 can be used in systems using a single frequency power supply, as well systems using more than two power supplies.

Figure 3:
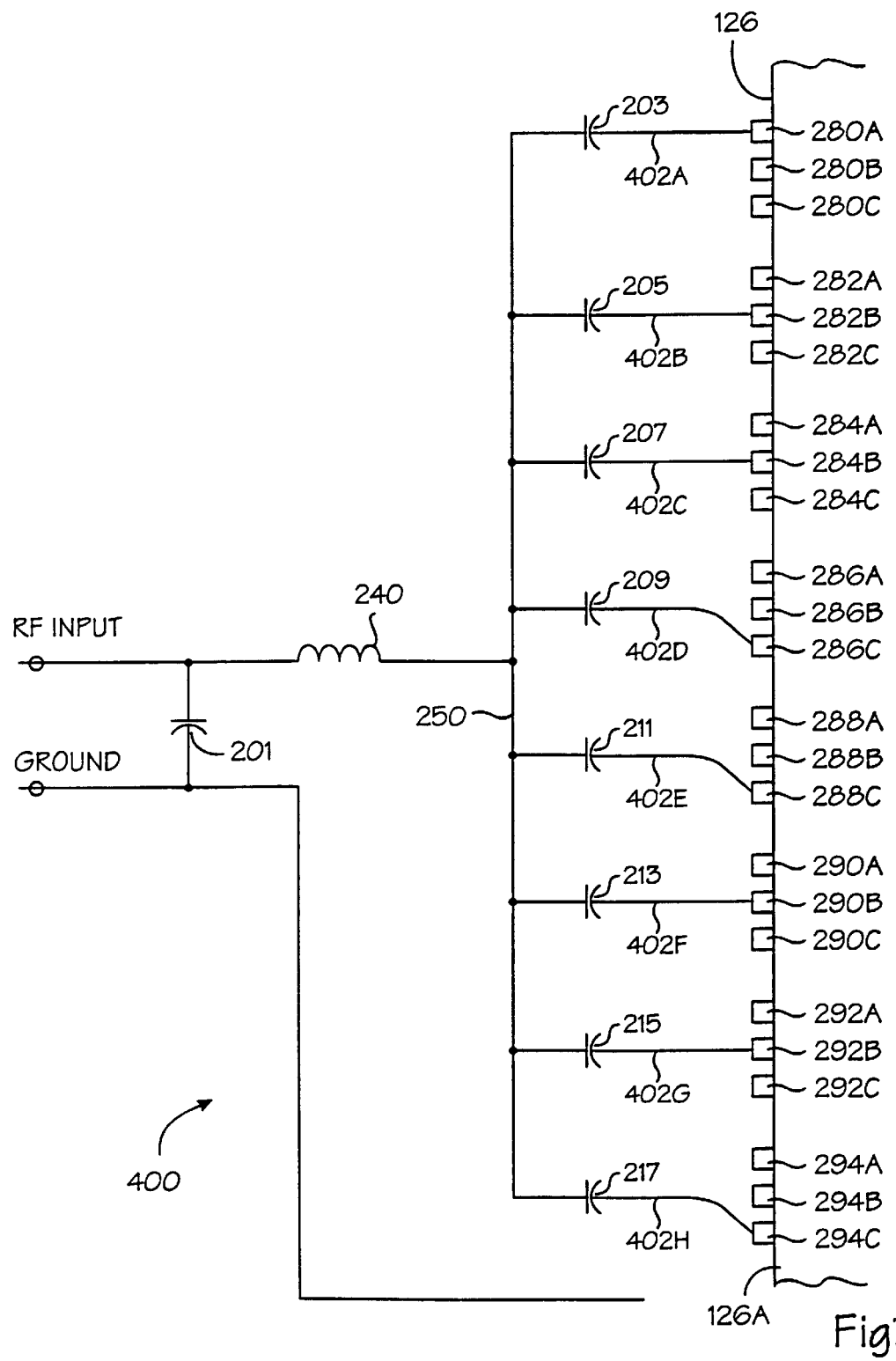
FIG. 3 is a schematic diagram illustrating a distributed matching network according to the invention.

An equivalent circuit of the distributed output for the matching network 400 is shown in FIG. 3. An RF input connector is provided to one end of a load capacitor 201 and to one end of an inductor 240. The second end of the capacitor 201 is grounded, while the second end of the inductor 240 is connected to drive capacitors 203, 205, 207, 209, 211, 213, 215 and 217. The outputs of the drive capacitors 203, 205, 207, 209, 211, 213, 215 and 217 relative to ground are the distributed outputs of the RF matching network 400. Each of the distributed outputs of the RF matching network 400 is coupled electrically to the backing plate 126 by respective conductive straps 402A through 402H. Additionally, each strap 402A through 402H can be connected by a user to the backing plate 126 at one of several respective possible drive or tie points located on the upper side of the backing plate 126. For example, conductive strap 402A can be tied to tie point 280A, 280B or 280C (collectively, tie points 280). Similarly, conductive strap 402B can be tied to one of three tie points 282A, 282B or 282C (collectively, tie points 282), and the other conductive straps 402C through 402H can be tied to respective groups of tie points 284, 286, 288, 290, 292 and 294 as shown in FIG. 3. Each of the tie points 280, 282, 284, 286, 288, 290, 292 and 294 includes a conductive stud that screws into the top of the backing plate 126 and provides a technique for easily removing and repositioning the output of each drive capacitor 203, 205, 207, 209, 211, 213, 215 and 217 in one of several positions an the backing plate 126. Alternatively, each tie point is slidable along a respective track (not shown) and can be fixed to the backing plate 126 in one several positions. Thus, the respective locations on the backing plate 126 to which the drive capacitors 203, 205, 207, 209, 211, 213, 215 and 217 are coupled electrically can be selected by a user. Although three tie points are shown for each strap 402A through 402H in FIG. 3, fewer or more tie points can be provided on the backing plate 126 for each conductive strap.

A predetermined composite capacitor value is determined experimentally for the particular system 130 to provide proper impedance matching between the chamber 133 and the power supply 410. The values of the particular capacitors 263, 205, 207, 209, 211, 213, 215 and 217 are selected by a user such that the combination of the parallel capacitors 203, 205, 207, 209, 211, 213, 215 and 217 has an equivalent capacitance equal to the predetermined composite capacitor value. In general, the best values of the capacitors 203, 205, 207, 209, 211, 213, 215 and 217 are determined experimentally.

Figure 4:
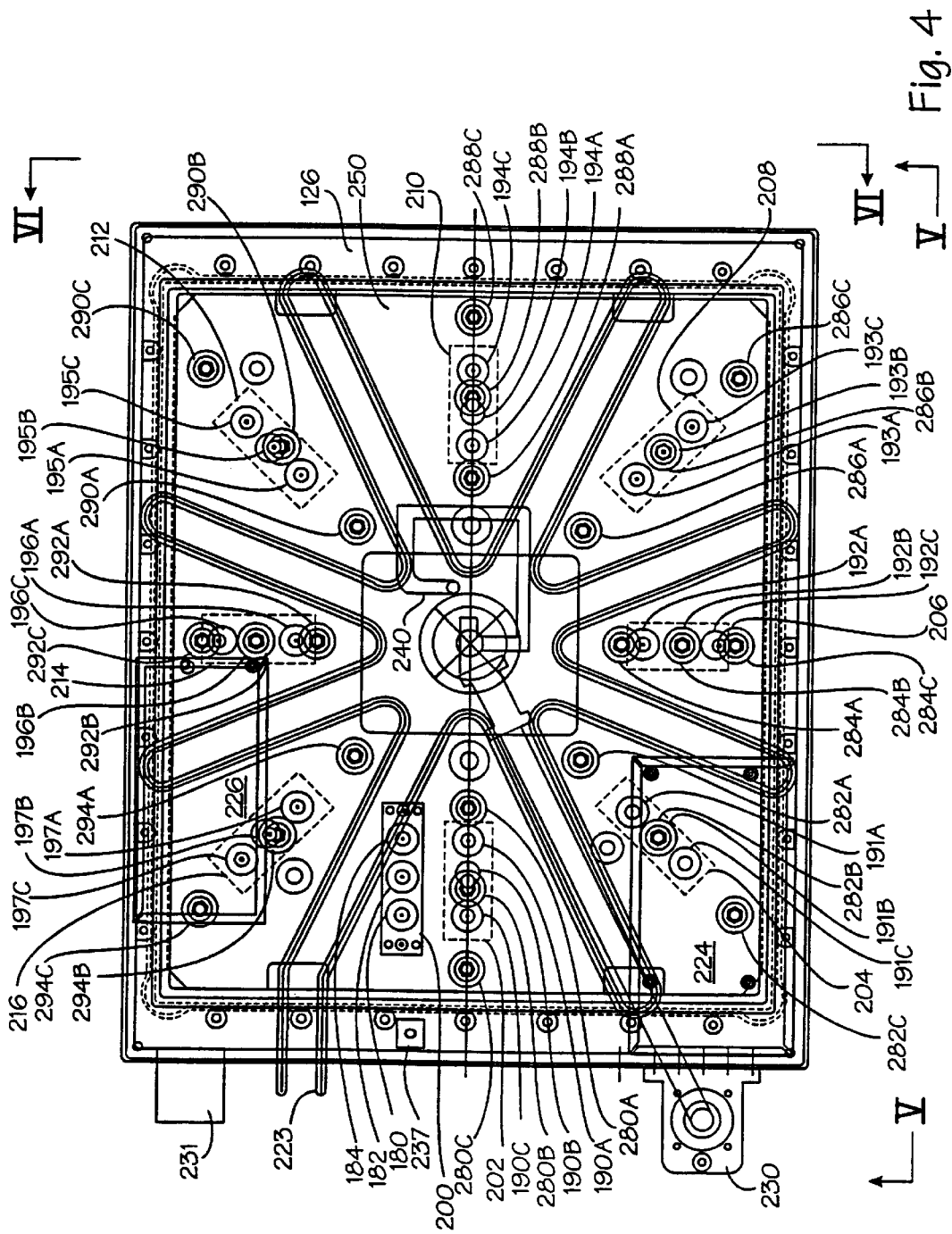
FIG. 4 illustrates an exemplary layout of various components associated with the distributed matching network.
Figure 5:
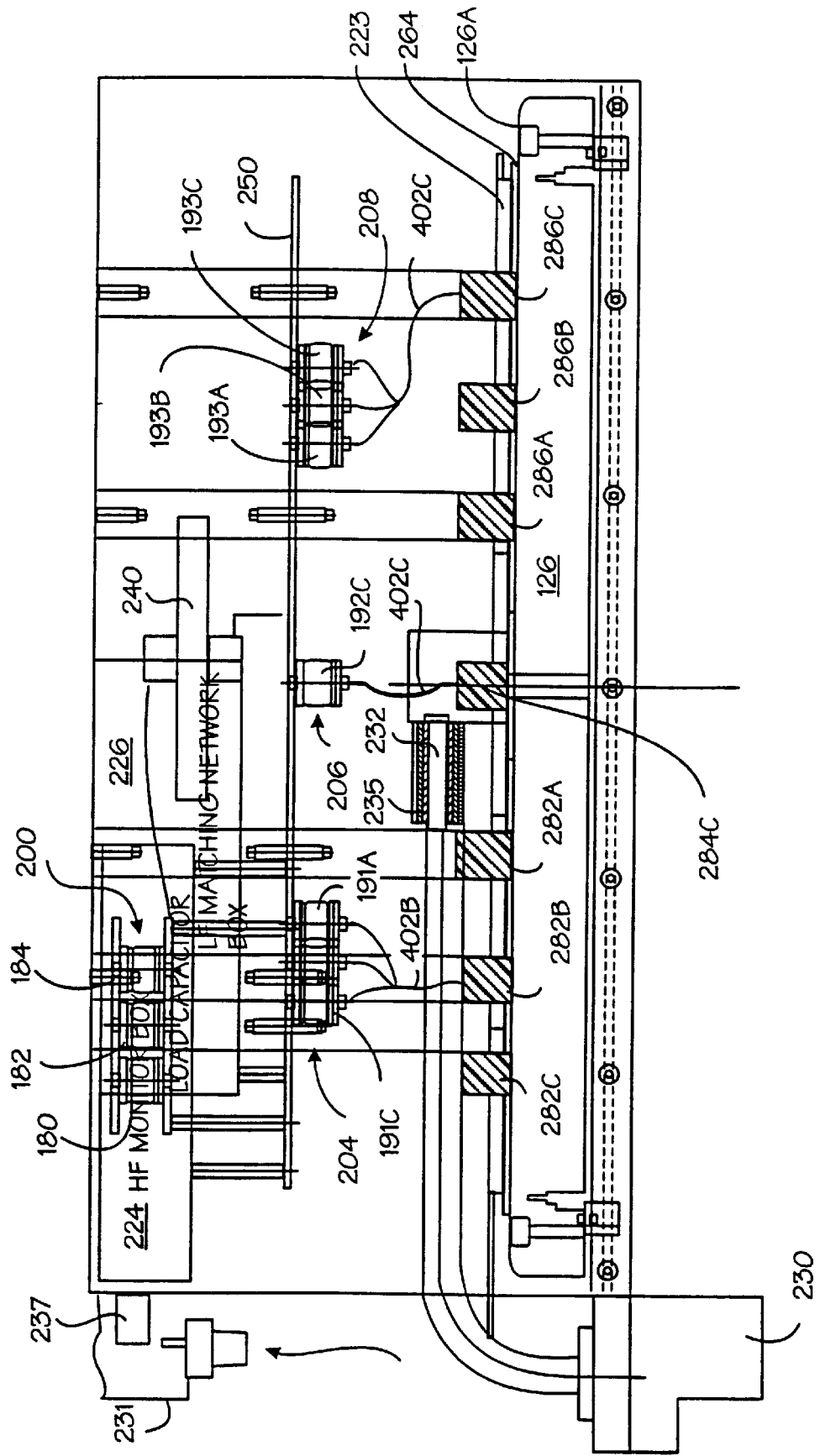
FIG. 5 is a partial cross-sectional view taken along lines V—V in FIG. 4.
Figure 6:
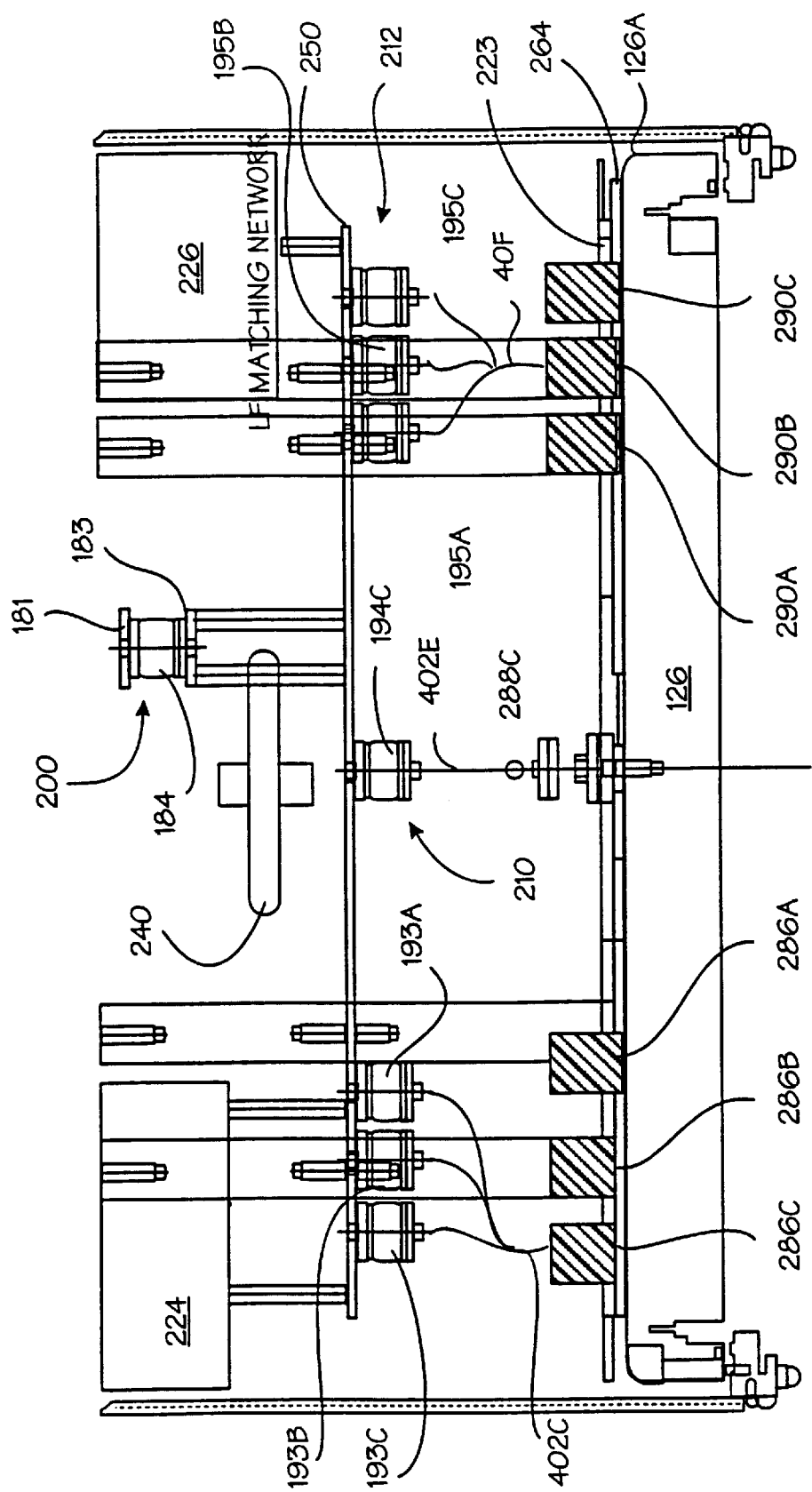
FIG. 6 is a partial cross-sectional view taken along lines VI—VI in FIG. 4.

In general, the load capacitor 201 can include a single capacitive element or multiple capacitive elements electrically coupled together. Similarly, each drive capacitor 203, 205, 207, 209, 211, 213, 215 and 217 can include a single capacitive element or multiple capacitive elements electrically coupled together. In various implementations, the capacitors 203, 205, 207, 209, 211, 213, 215 and 217 can be either manual variable capacitors or motor-driven variable capacitors, thereby allowing a user to select and change the value of one or more of the capacitors In one implementation, the load capacitor 201 is mounted in a load capacitor assembly 200 (FIGS. 4, 5 and 6). As illustrated in FIG. 4, the load capacitor assembly 200 includes three mount positions 180, 182, 184 which are adapted to receive up to as many as three capacitive elements that form the load capacitor 201. One side 181 (FIG. 6) of the assembly 200 is grounded by being electrically attached to the body of an input connector. The other side 183 of the assembly 200 is the RF input to the HF matching network 400 and is attached to a center contact of the input connector.

As illustrated in FIGS. 4–6, each drive capacitor 203, 205, 207, 209, 211, 213, 215, 217 is mounted in a respective drive capacitor assembly 202, 204, 206, 208, 210, 212, 214 and 216. Each of the drive assemblies 202, 204, 206, 208, 210, 212, 214 and 216 is attached to the underside of the conductive plate 250 and is electrically coupled to the backing plate 126 by one of the conductive straps 402A through 402H. Each of the drive capacitor assemblies 202, 204, 206, 208, 210, 212, 214, 216 includes three mount positions which are adapted to receive up to as many as three capacitive elements that form one of the drive capacitors 203, 205, 207, 209, 211, 213, 215 and 217. Specifically, the drive capacitor assembly 202 has mount positions 190A, 190B and 190C, the drive capacitor assembly 204 has mount positions 191A, 191B and 191C, the drive capacitor assembly 206 has mount positions 192A, 192B and 192C, and the drive capacitor assembly 208 has mount positions 193A, 193B and 193C. Similarly, the drive capacitor assembly 210 has mount positions 194A, 194B and 194C, the drive capacitor assembly 212 has mount positions 195A, 195B and 195C, the drive capacitor assembly 214 has mount positions 196A, 196B and 196C, and the drive capacitor assembly 216 has mount positions 197A, 197B and 197C. Once mounted, one side of each drive capacitor is electrically in contact with the output side of the inductor 240, while the other side is electrically in contact with the backing plate 126.

As illustrated by FIG. 4, according to one implementation, the layout of the drive capacitor assemblies 202, 204, 206, 208, 210, 212, 214 and 216 on the conductive plate 250 is such that the assemblies are separated from one another by approximately 45 degrees. The tie points 280, 282, 284, 286, 288, 290, 292 and 294 are positioned on the backing plate 126 and are located directly below the associated one of the capacitor assemblies. Thus, the groups of tie points also are separated from one another by about 45 degrees. The individual tie points in a particular group, for example, tie points 280A, 280B and 280C, are positioned in a line on the backing plate 126 such that the tie point 280A is closest to the center of the backing plate, the tie point 280B is somewhat further from the center, and the tie point 280C is furthest from the center.

A high frequency (HF) monitor box 224 also is located on top of the chamber 133. The HF monitor box 224 analyzes various voltage and current outputs presented at the matching network outputs from the drive capacitors 203, 205, 207, 209, 211, 213, 215 and 217 to determine losses in the matching network 400.

In addition, a gas feed connector 230 (FIGS. 4 and 5) is associated with the backing plate 126 and supplies process gas to the system. Process gas enters at the bottom of the connector 230 and travels through a tube on top of the connector 230 and through a gas voltage isolation assembly 232 (FIG. 5). The gas voltage isolation assembly 232 includes a glass tube which is surrounded by a resistor 235 to grade the voltage from ground to a high voltage point on the top of the backing plate. Gas is introduced through the backing plate 126 and delivered to a plenum 125 area below the backing plate 126 and above the showerhead 122 (FIG. 1). Gas then is forced to flow through the showerhead 122 into the process chamber 133. The resistor 235 grades the voltage to prevent electromagnetic fields from bunching at the end of the tube and, thus reduces or eliminates electrical discharges inside the gas tube.

RF power input connectors 231, 237 (FIGS. 4 and 5) also are associated with the backing plate 126. The RF power input connector 231 receives the high frequency power input from the high frequency power supply 410, and the RF power input connector 237 receives the low frequency power input from the power supply 430. The connectors 231, 237 face downward such that power coaxial cables may be dressed up in a vertical fashion.

To dissipate heat from the backing plate 126, a copper tube 223 (FIGS. 4–6) circulates water to cool the plate 126. The tube 223 is grounded and is mounted above an insulating plate 264 (FIGS. 5–6). The circulation of water through the tube 223 cools the top 126A of the backing plate 126 below 100° C. to protect various elastomeric seals located in the chamber 133.

By supporting movable tie points from the RF power supply outputs to the topside of the backing plate, the system provides a spatial control variable which allows a user to select or adjust the locations on the backing plate to which the drive capacitors are coupled electrically. Additionally, by allowing a user to select the individual values of the capacitors 203, 205, 207, 209, 211, 213, 215 and 217, the system provides an electrical control variable. The spatial control variable and the electrical control variable supplement the traditional process variables, including pressure, gas composition, flow rate, RF power level, and electrode spacing such that more uniform films can be deposited. Specifically, as previously described, a user can adjust the values of the variable drive capacitors as well as the locations of the points on the backing plate to which the drive capacitors are coupled to improve the uniformity of the deposited film. Other film properties such as density and stress also are improved, and a high deposition rate can be achieved. As previously noted, the optimal capacitor values and the optimal positions of the tie points are determined experimentally for a given configuration.

Although the present invention has been illustrated and described in the context of a PECVD system, the present invention is applicable to other types of CVD systems as well as systems using other plasma enhanced processing methods, such as etching. Similarly, although the particular embodiment described above shows eight distributed outputs that are arranged in a radial manner with respect to the center of the backing plate 126, any number of distributed outputs may be used in any configuration. As previously discussed, use of a distributed impedance matching network is not limited to systems with a dual frequency power supply. Rather, the distributed matching network can be incorporated into systems having only a single frequency power supply as well as systems using power supplies having more than two frequencies. Changes to the gas mixtures, temperatures and pressures also can be made.

In some implementations, instead of tuning the frequencies of the power supplies, the impedance matching circuits can be tuned. Moreover, various electrode spacings may be used, and various sequences of heating and cycling of the power supplies can be carried out, depending upon the films and deposition sequences desired.

Other implementations are within the scope of the claims.

What is claimed is:

1. A system for generating plasma in processing a substrate, the system comprising:
    a vacuum chamber adapted to contain a plasma and having a first electrode;
    a load capacitor adapted to receive a radio frequency power input;
    a plurality of user-selectable drive points distributed on said first electrode;
    an inductor having first and second ends, the first end coupled to the load capacitor; and
    a plurality of drive capacitors, wherein each drive capacitor has associated therewith a plurality of selectable drive points and each drive capacitor electrically couples the second end of the inductor to a selected one of said plurality of user-selectable drive points associated with that drive capacitor.

2. The system of claim 1 wherein said chamber has a pair of parallel plate electrodes of which said first electrode is one plate electrode.

3. The system of claim 1, further including a cooling system coupled to the first electrode.

4. The system of claim 1, further including a high frequency power supply adapted to supply the radio frequency power input to the load capacitor and the inductor.

5. The system of claim 4, further including a low frequency power supply coupled to the first electrode.

6. The system of claim 1, wherein the capacitance of each drive capacitor is user-selectable.

7. The system of claim 1, wherein the selectable drive points on the first electrode associated with each drive capacitor include three user-selectable drive points.

8. A system for generating plasma in depositing films on a substrate, the system comprising:
    a vacuum chamber adapted to contain a plasma and having a first electrode;
    a first RF power supply;
    a plurality of user-selectable drive points distributed on said first electrode; and
    a first matching network coupling the first RF power supply to selected drive points on the first electrode, said network having a plurality of outputs fewer in number than said plurality of user-selectable drive points, each output being coupled to a selected one of said plurality of drive points distributed on the first electrode.

9. The system of claim 8 wherein said chamber has a pair of parallel plate electrodes of which said first electrode is one plate electrode.

10. The system of claim 8, wherein the first matching network further comprises:
    a load capacitor adapted to receive a radio frequency power input;
    an inductor having first and second ends, the first end coupled to the load capacitor; and
    a plurality of drive capacitors each of which couples the second end of the inductor to a different one of the plurality of points distributed on the first electrode.

11. The system of claim 10, further including:
    a second RF power supply; and
    a frequency matching and filtering network coupling the second RF power supply to the first electrode.

12. The system of claim 10, wherein the capacitance of each drive capacitor is user-selectable.

13. The system of claim 10, wherein the user-selectable drive points on the first electrode associated with each drive capacitor include three user-selectable drive points.

14. A method of processing a thin film on a substrate in a vacuum chamber, comprising:
    providing a radio frequency power input to a load capacitor and an inductor, the inductor being coupled to a plurality of drive capacitors; and
    applying an output of each respective drive capacitor to a selected one of a plurality of selectable drive points distributed on a first electrode in a parallel plate electrode system to generate a plasma in said vacuum chamber.

15. The method of claim 14, further including adjusting the capacitance of each drive capacitor to arrive at a composite predetermined value.

16. The method of claim 14, further including adjusting locations of the points on the first electrode to which the plurality of drive capacitors are coupled by selecting different drive points to improve the uniformity of a deposited film.

17. The method of claim 14, further including adjusting the capacitance of each drive capacitor to improve the uniformity of a deposited film.

18. A system for generating plasma in processing a substrate for use with an RF power supply, the system comprising:
    a vacuum chamber adapted to contain a plasma and having first and second parallel plate electrodes;
    a plurality of user-selectable drive points distributed on said first electrode; and
    a matching network having a plurality of outputs adapted to couple RF power from said supply to selected drive points on the first electrode, wherein said user-selectable drive points include repositioning means for permitting a user to reposition each network output from a first selected drive point to a second selected drive point on said first electrode.

19. The system of claim 18 wherein said repositioning means includes a plurality of conductive studs, each stud being adapted to screw into said first electrode at a selected drive point.

20. The system of claim 18 wherein said repositioning means includes a tie adapted to slide a matching network output from a first drive point to a second drive point.

21. The system of claim 18 wherein each network output includes a drive capacitor, said system further including means for adjusting the capacitance of each drive capacitor.

22. The system of claim 18 wherein said first electrode defines a center and each network output has a plurality of user-selectable drive points associated therewith and distributed radially on said first electrode with respect to said first electrode center.

23. The system of claim 22 wherein each plurality of radially distributed drive points is separated from an adjacent plurality of radially distributed drive points by an angle of 45 degrees.

24. A system for generating plasma in depositing films on a substrate, the system comprising:
- a vacuum chamber adapted to contain a plasma, said chamber having first and second parallel plate electrodes wherein the first electrode defines a center;
- a plurality of user-selectable drive points distributed on said first electrode; and
- a matching network adapted to be coupled to the RF power supply and having a plurality of outputs, each output including a drive capacitor adapted to couple the RF power to a selected one drive point of a plurality of user-selectable drive points associated with the drive capacitor;
- wherein each plurality of user-selectable drive points associated with a drive capacitor is distributed radially on said first electrode with respect to the center of said first electrode and includes repositioning means for permitting a user to reposition each network drive capacitor output in a radial direction from a first selected drive point to a second selected drive point of the plurality of user-selectable drive points associated with the drive capacitor; and
- wherein each matching network output has means for adjusting the capacitance of the drive capacitor of the network output.

25. A method of processing a substrate in a vacuum chamber, comprising:
- moving an output of a matching network from a first drive point to a second drive point of a plurality of selectable drive points distributed on an electrode in a parallel plate electrode system; and
- providing radio frequency power to said second drive point through said matching network to generate a plasma in said vacuum chamber.

26. The method of claim 25 wherein said moving includes disconnecting the matching network output from the first drive point and reconnecting the output to the second drive point.

27. The method of claim 26 wherein said reconnecting includes screwing the matching network output to the second drive point.

28. The method of claim 25 wherein said moving includes sliding the matching network output from the first drive point to the second drive point.

29. The method of claim 25 wherein each network output includes a drive capacitor, said method further including adjusting the capacitance of each drive capacitor.

30. The method of claim 25 wherein said electrode defines a center and said moving includes moving the matching network output from the first drive point to the second drive point in a radial direction with respect to said electrode center.

31. A method of processing a film on a substrate in a vacuum chamber, comprising:
- moving a first drive capacitor output of a matching network from a first drive point to a second drive point of a first plurality of selectable drive points distributed on an electrode radially with respect to the center of the electrode in a parallel plate electrode system of said vacuum chamber;
- adjusting the capacitance of the first drive capacitor;
- moving a second drive capacitor output of said matching network from a first drive point to a second drive point of a second plurality of selectable drive points distributed radially on said electrode with respect to the center of said electrode in said parallel plate electrode system wherein the second plurality of radially distributed drive points is separated from the first plurality of radially distributed drive points by an angle of 45 degrees;
- adjusting the capacitance of the second drive capacitor; and
- providing radio frequency power to said second drive points of said first and second pluralities of drive points through said matching network to generate a plasma in said vacuum chamber.

32. A system for generating plasma in processing a substrate, the system comprising:
- a vacuum chamber adapted to contain a plasma and having first and second parallel plate electrodes;
- an RF power supply;
- a plurality of user-selectable drive points distributed on said first electrode; and
- a matching network having a plurality of outputs adapted to couple the RF power to selected drive points on the first electrode, wherein said plurality of user-selectable drive points include a plurality of repositionable connectors, each connector being adapted to permit a user to reposition an associated network output from a first selected drive point to a second selected drive point on said first electrode.

33. The system of claim 32 wherein each repositionable connector includes a conductive stud, each stud being adapted to screw into said first electrode at a selected drive point.

34. The system of claim 32 wherein each repositionable connector includes a tie adapted to slide a matching network output from a first drive point to a second drive point.

35. The system of claim 32 wherein each network output includes at least one drive capacitor and a plurality of capacitor mounts adapted to mount a user-selected number of capacitors so that said user-selected number of capacitors is connected to the associated repositionable connector of that network output.

36. The system of claim 32 wherein said first electrode defines a center and each network output has a plurality of user-selectable drive points associated therewith and distributed radially on said first electrode with respect to said first electrode center.

37. The system of claim 36 wherein each plurality of radially distributed drive points is separated from an adjacent plurality of radially distributed drive points by an angle of 45 degrees.

38. A system for generating plasma in depositing films on a substrate, the system comprising:
- a vacuum chamber adapted to contain a plasma, said chamber having first and second parallel plate electrodes wherein the first electrode defines a center;
- a plurality of user-selectable drive points distributed on said first electrode; and
- a matching network adapted to be coupled to the RF power supply and having a plurality of outputs, each output including a drive capacitor adapted to couple the RF power to a selected one drive point of a plurality of user-selectable drive points associated with the drive capacitor;
- wherein each plurality of user-selectable drive points associated with a drive capacitor is distributed radially on said first electrode with respect to the center of said first electrode, separated from an adjacent plurality of radially distributed drive points by an angle of 45 degrees, and wherein each plurality of user-selectable drive points associated with a drive capacitor includes a repositionable connector which is adapted to permit a user to reposition an associated network output in a radial direction from a first selected drive point to a second selected drive point of the plurality of user-selectable drive points associated with the drive capacitor; and wherein each network output includes a plurality of capacitor mounts adapted to mount a user-selected number of capacitors so that said user-selected number of capacitors is connected to the associated repositionable connector of that network output.

* * * * *